US 6,683,453 B2

(12) United States Patent
Heid

(10) Patent No.: US 6,683,453 B2
(45) Date of Patent: Jan. 27, 2004

(54) MAGNETIC RESONANCE APPARATUS FOR OBTAINING NMR NAVIGATOR ECHOES WITH SLIGHT DISTURBANCE OF THE LONGITUDINAL MAGNETIZATION

(75) Inventor: Oliver Heid, Gunzenhausen (DE)

(73) Assignee: Siemens Aktiengesellschaft, München (DE)

(*) Notice: Subject to any disclaimer, the term of this patent is extended or adjusted under 35 U.S.C. 154(b) by 51 days.

(21) Appl. No.: 09/948,885

(22) Filed: Sep. 7, 2001

(65) Prior Publication Data

US 2002/0033698 A1 Mar. 21, 2002

(30) Foreign Application Priority Data

Sep. 8, 2000 (DE) .......................... 100 44 424

(51) Int. Cl.⁷ ................................. G01V 3/00
(52) U.S. Cl. ....................................... 324/307
(58) Field of Search .................. 324/307, 309

(56) References Cited

U.S. PATENT DOCUMENTS

| 5,307,812 A | * | 5/1994 | Hardy et al. ................. 600/411 |
| 5,323,779 A | * | 6/1994 | Hardy et al. ................. 600/411 |
| 5,327,884 A | * | 7/1994 | Hardy et al. ................. 600/411 |
| 5,539,312 A | | 7/1996 | Fu et al. |
| 5,541,512 A | * | 7/1996 | Dumoulin et al. ........... 324/309 |
| 5,869,965 A | * | 2/1999 | Du et al. ...................... 324/309 |
| 5,923,168 A | * | 7/1999 | Zhou et al. .................. 324/309 |
| 6,037,771 A | | 3/2000 | Liu et al. |
| 6,043,651 A | | 3/2000 | Heid |
| 6,043,652 A | * | 3/2000 | Liu ............................. 324/309 |
| 6,044,290 A | * | 3/2000 | Vigen et al. ................. 600/419 |
| 6,064,205 A | * | 5/2000 | Zhou et al. .................. 324/309 |
| 6,078,175 A | * | 6/2000 | Foo ............................. 324/306 |
| 6,157,192 A | * | 12/2000 | Cordes ........................ 324/309 |

FOREIGN PATENT DOCUMENTS

EP         0 909 958         4/1999

* cited by examiner

Primary Examiner—Edward Lefkowitz
Assistant Examiner—Dixomara Vargas
(74) Attorney, Agent, or Firm—Schiff Hardin & Waite

(57) ABSTRACT

In a magnetic resonance imaging apparatus and method for obtaining NMR navigator echoes with slight disturbance of the longitudinal magnetization, an EPI pulse sequence is generated to irradiate an object to be examined. Excitation which is selective by means of a slice selection gradient, and which has a small flip angle $\alpha<90°$ forms a navigator slice and supplies a signal which is read out in the EPI pulse sequence using phase encoding in a direction perpendicular to the slice selection direction and the read out direction. A spatially resolved navigator rod is obtained by reconstructing a column or row of the navigator slice.

10 Claims, 3 Drawing Sheets

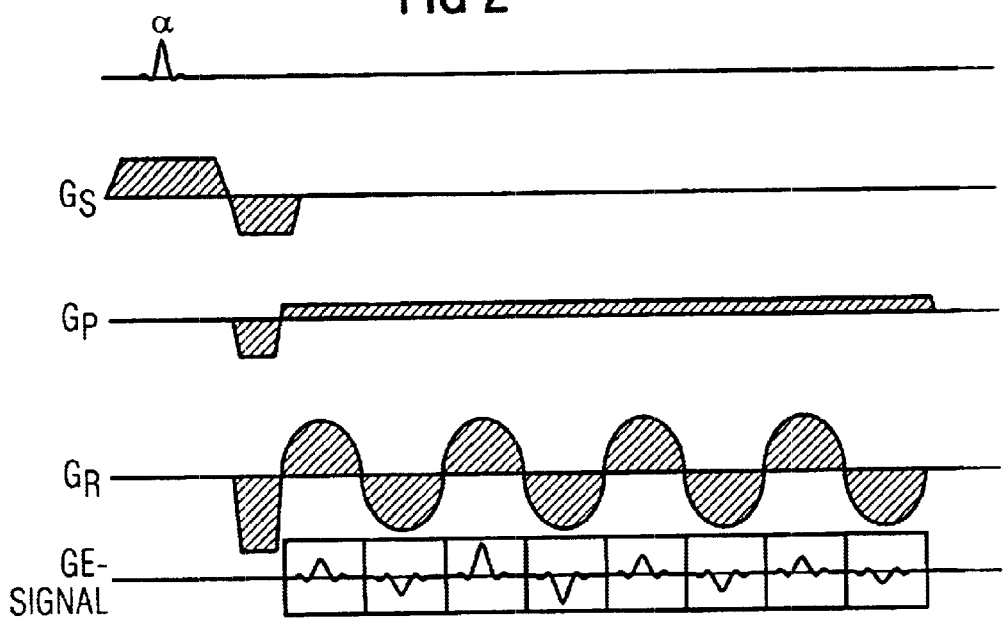
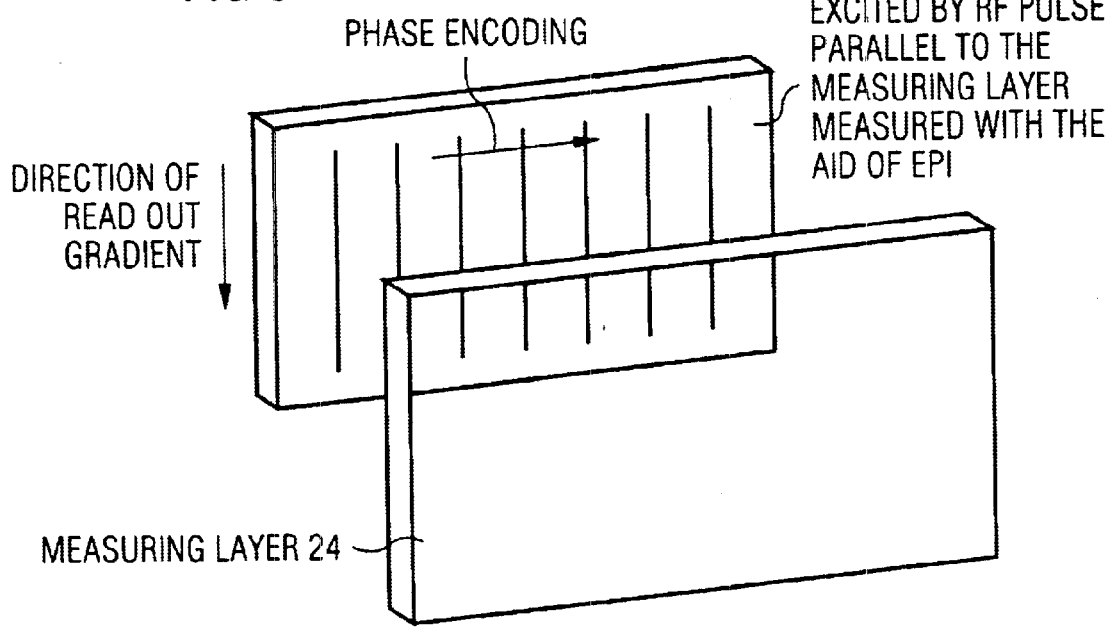

US 6,683,453 B2

MAGNETIC RESONANCE APPARATUS FOR OBTAINING NMR NAVIGATOR ECHOES WITH SLIGHT DISTURBANCE OF THE LONGITUDINAL MAGNETIZATION

FIELD OF THE INVENTION

The present invention relates in general to magnetic resonance imaging (magnetic resonance tomography) as applied in medicine for examining patients. The present invention relates, in particular, to a magnetic resonance imaging apparatus and to a method for operating such an apparatus, of the type employing an EPI pulse sequence to obtain a spatially resolved navigator rod on the longitudinal axis of the body.

DESCRIPTION OF THE PRIOR ART

Magnetic resonance imaging is a tomographic method for medicine diagnostics which is distinguished first and foremost by a high contrast resolving power. Because of its excellent ability to display soft tissue, magnetic resonance imaging has developed into a method greatly superior to X-ray computed tomography. Magnetic resonance imaging is currently based on the application of spin echo and gradient echo sequences which permit an excellent image quality in conjunction with measuring times of the order of magnitude of minutes.

In many fields of medical diagnostics, it is of interest to display physiological processes by means of magnetic resonance images. It is necessary for this purpose to synchronize these physiological processes with the appropriate magnetic resonance methods.

A typical application is the monitoring of the position of the heart when obtaining heart images. Obtaining the position information is facilitated, for example, by a profile of the spin density in a rod on the longitudinal axis of the body, a so-called navigator rod.

In known techniques, a navigator rod is usually obtained by means of a spin echo sequence whose selective 90° and 180° RF pulses have respective slice planes that intersect as a cross. The spin echo is therefore produced exclusively in the intersection region of the two slice planes.

However, this method has the significant disadvantage that the longitudinal magnetization in the two slices, as well as in the intersection region with the measuring volume, is saturated or inverted. The orientations of the two planes therefore must be selected such that they do not intersect the volume of the following image measurement.

Apart from difficult manipulation, this has the consequence that, for example, the movement of the heart due to breathing cannot be measured directly, but must be derived from the movement of the more effectively accessible other half of the diaphragm.

SUMMARY OF THE INVENTION

It is an object of the present invention to provide a magnetic resonance apparatus and method which permit a navigator rod to be obtained without impairing the measuring volume for the subsequent measurement.

This object is achieved in accordance with the invention in a magnetic resonance apparatus which has a system for generating an EPI pulse sequence which irradiates an object to be examined. Excitation, which is selective by means of a slice selection gradient which has a small flip angle $\alpha < 90°$, produces a signal which is read out using phase encoding in a direction perpendicular to the slice selection direction and read out direction and is used to obtain a spatially resolved navigator rod.

The navigator slice is usually arranged parallel to a measuring slice used in a subsequent measurement.

The oscillating read out gradient has positive and negative gradient lobes, the echoes of both gradient lobes or of only one lobe being used.

The signals of a column/row of the navigator slice fixed by the slice selection direction are added by weighted addition to form an aggregate echo from which the navigator rod is calculated.

In accordance with the invention and a method for operating a magnetic resonance imaging apparatus wherein nuclear spins are excited with an excitation pulse having a small flip angle which is less than 90°, activating a slice selection gradient, activating a phase encoding gradient, generating multiple gradient echoes with an oscillating read out gradient, thereby obtaining a set of gradient echoes following the excitation pulse, and generating a spatially resolved navigator rod from a signal from the selective excitation with the small flip angle of less than 90°, this signal being read out with phase encoding in a direction perpendicular to the slice selection direction and perpendicular to the read out direction.

DESCRIPTION OF THE DRAWINGS

FIG. 2 shows a schematic of a conventional EPI pulse sequence.

FIG. 3 shows a schematic of the navigator slice, measured with EPI, parallel to the measuring slice.

DESCRIPTION OF THE PREFERRED EMBODIMENTS

Figure 1:
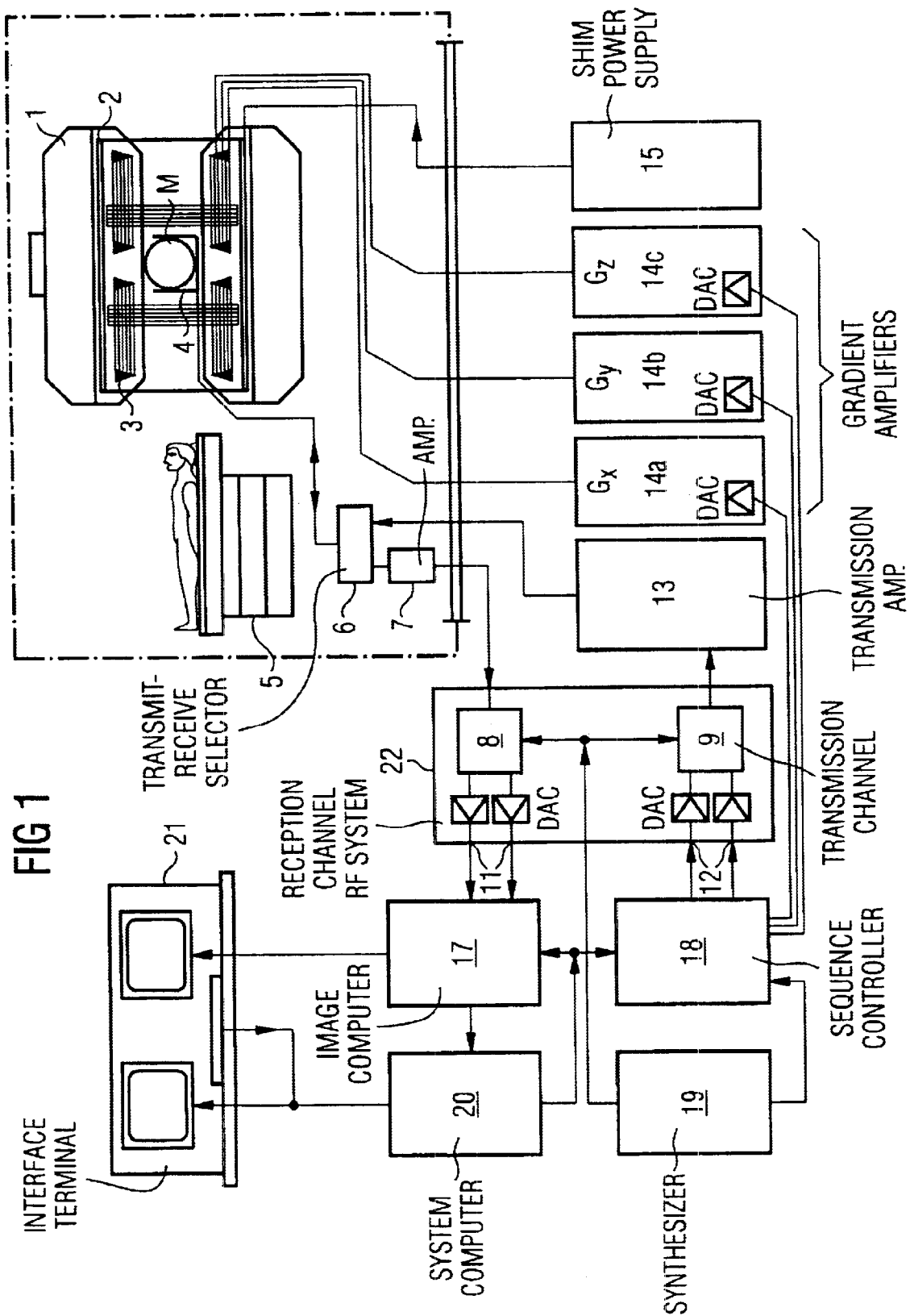
FIG. 1 is a schematic of a magnetic resonance imaging apparatus.

FIG. 1 shows a schematic of a magnetic resonance apparatus for generating a nuclear spin image of an object in accordance with the present invention. The basic components of the magnetic resonance apparatus correspond to the design of a conventional tomography apparatus, except for the system computer ?? which is programmed in accordance with the invention. A basic field magnet 1 generates an homogenous constant strong magnetic field for polarizing and aligning the nuclear spin in the area of examination of an object such as, for example, a part of a human body that is to be examined. The high level of homogeneity of the basic magnetic field required for producing the magnetic resonance signals is defined in a spherical measuring volume M into which the parts of the human body that are to be examined are introduced. In order to support the homogeneity requirements and, in particular, to eliminate temporally invariable influences, so-called shim plates made from ferromagnetic material are fitted at a suitable location. Temporally variable influences are eliminated by shim coils 2 which are driven by a shim power supply 15.

A cylindrical gradient coil system 3 which consists of three component windings is inserted into the basic field magnets 1. The component windings are supplied with power by respective amplifiers 14a, 14b and 14c in order to generate respective linear gradient fields in the respective directions of a Cartesian coordinate system. The first component winding of the gradient field system 3 in this case generates a gradient $G_x$ in the x-direction, the second component winding generates a gradient $G_y$ in the y-direction, and the third component winding generates a gradient $G_z$ in the z-direction. Each amplifier 14a, 14b and 14c has a digital-to-analog converter which is driven by the sequence controller 18 for correctly timed generation of gradient pulses.

Located inside the gradient field system 3 is a radio-frequency antenna 4 which converts the radio-frequency pulses from a radio-frequency power amplifier 30 into an alternating magnetic field for exciting the nucleus and aligning the nuclear spin of the object to be examined, or that volume of the object which is to be examined. The radio-frequency antenna 4 also converts the alternating field emanating from the precessing nuclear spins, generally the nuclear spin echo signals produced by a pulse sequence from one or more radio-frequency pulses and one or more gradient pulses, into a voltage which is fed via an amplifier 7 to a radio-frequency reception channel 8 of a radio-frequency system 22. The radio-frequency system 22 further has a transmitting channel 9 in which the radio-frequency pulses are generated for exciting the magnetic resonance signals. In this case, the radio frequency pulses are represented digitally as a sequence of complex numbers on the basis of a pulse sequence, prescribed by the system computer 20, in the sequence controller 18. This number sequence is fed to a digital-to-analog converter in the radio-frequency system 22, and from the latter to a transmitting channel 9, as a real part and an imaginary part, via respective inputs 12. The pulse sequence is modulated in the transmitting channel 9 onto a radio-frequency carrier signal whose basic frequency corresponds to the resonant frequency of the nuclear spins in the measuring volume. The modulated pulse sequence is supplied to a transmission amplifier 13.

The switchover from transmit to receive mode is performed via a transmit-receive selector 6. The radio-frequency antenna 4 irradiates the measuring volume M with the radio-frequency pulses for exciting the nuclear spins, and samples the resulting echo signals. The correspondingly obtained magnetic resonance signals are demodulated in the receiving channel 8 of the radio-frequency system 22 in a phase-sensitive fashion and converted via respective analog-to-digital converters into a real part and an imaginary part of the measuring signal. An image computer 17 reconstructs an image from the measured data obtained in this way. The administration of the measured data, the image data and the control programs is performed via the system computer 20. By prescribing control programs, the sequence controller 18 controls the generation of the respectively desired pulse sequences and the corresponding scanning of k space. In particular, the sequence controller 18 in this case controls the correctly timed switching of the gradients, the emission of the radio-frequency pulses with defined phase and amplitude, and the reception of the magnetic resonance signals. The time base for the radio-frequency system 22 and the sequence controller 18 is made available by a synthesizer 19. The selection of appropriate control programs for generating a magnetic resonance image, and the representation of the magnetic resonance image generated, are performed at an interface terminal 21 which has a keyboard and one or more display screens.

FIG. 2 schematically illustrates a classic EPI pulse sequence. EPI stands for "echo planar imaging". First, the gradient field system 3 (FIG. 1) applies a phasing slice selection gradient, and in the meantime a radio-frequency exciting pulse is emitted by the radio-frequency power amplifier 30 (FIG. 1).

After the excitation pulse, all the gradients are switched into a dephasing direction for a short time. The read out gradient, applied thereafter together with the positively switched phase encoder gradient, has an oscillating profile, i.e., it has positive and negative gradient lobes which are, for example, of a sinusoidal nature. As a result, several gradient echoes are generated in the read out direction and fed to the radio-frequency receiving channel 8 of the radio-frequency system 22 (FIG. 1). The phase encoding is performed in this example by a permanently activated phase encoding gradient.

The solution according to the invention is illustrated in FIG. 3. Navigator slice 23 is defined by means of a slice selection gradient by selective excitation in a first transverse direction with a small flip angle $\alpha < 90°$. The selective excitation generates a signal which is read out with phase encoding in a direction perpendicular to the directions of slice selection and read out. Specifically read out occurs with an oscillating read out gradient which generates several gradient echoes.

In contrast to pure EPI, in order to obtain a one-dimensional, spatially resolved navigator rod, it is typically necessary to reconstruct only a single column or row of a navigator slice. In this process, the echoes of both gradient lobes or, in order to avoid the problems of time raster alignment, only those of one lobe each can be used, since only a very coarse resolution is required (order of magnitude 2 cm).

It is recommended to combine the phase-encoded signals by means of weighted addition to form an aggregate echo which then supplies the desired rod protection after a one-dimensional Fourier transformation.

Figure 4:
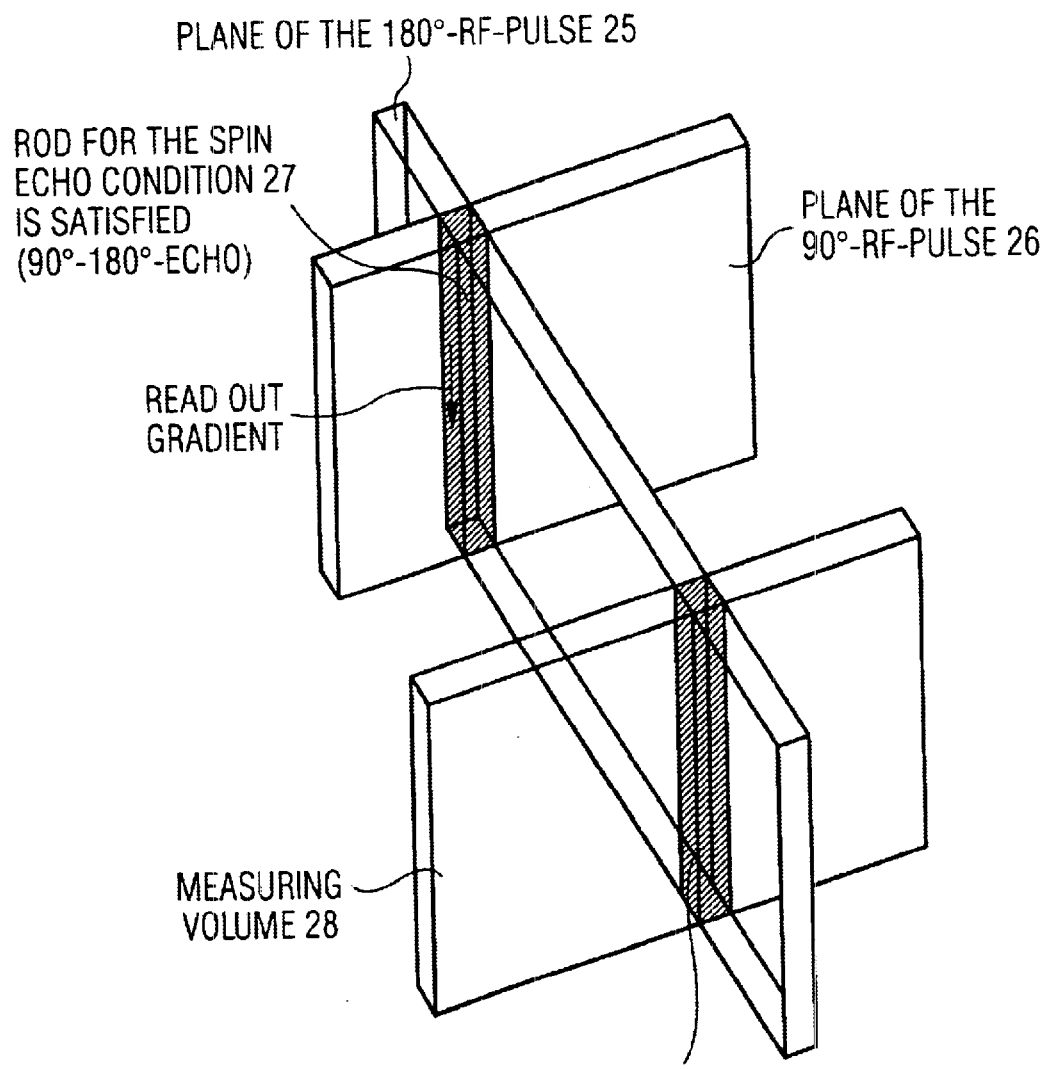
FIG. 4 shows a schematic of the rod-shaped navigator echo, generated by crossed slice-selective 90° and 180° RF pulses in accordance with the prior art.

When the measuring slice 24 used for subsequent measurement is normally selected to be parallel to the navigator slice 23, no disturbing saturation or inversion of the longitudinal magnetization occurs in an intersection region, as it does in accordance with the prior art, as exemplified in FIG. 4.

However, if it is unavoidable, given the very small flip angle ($\alpha < 30°$), the navigator slice and measuring slice may also intersect, since then the relaxation time of the spins is very short and therefore a high measurement repetition rate is possible.

Although modifications and changes may be suggested by those skilled in the art, it is the intention of the inventors to embody within the patent warranted heron all changes and modifications as reasonably and properly come within the scope of their contribution to the art.

I claim as my invention:

1. A magnetic resonance imaging apparatus comprising:
    an RF system for emitting radio frequency excitation pulses into an examination subject and for receiving magnetic resonance signals resulting therefrom;
    a gradient system for generating a plurality of gradients; and
    a system computer connected to said RF system and to said gradient system for producing an EPI pulse sequence having an excitation pulse for exciting nuclear spins with a flip angle of less than 90°, a slice selection gradient in slice selection direction, a phase encoding gradient, and an oscillating read out gradient for reading out a plurality of gradient echoes after said excitation pulse, and for obtaining a spatially resolved navigator rod for correcting motion artifacts in subsequently obtained magnetic resonance images of said subject, by reading out signals from a single slice produced by excitation of said nuclear spins which is made selective by said slice selection gradient and said flip angle, with phase encoding in a direction perpendicular to said slice selection direction and perpendicular to said read out direction.

2. A magnetic resonance imaging apparatus as claimed in claim 1 wherein said system computer fixes a navigator slice, as said single slice, with said slice selection direction parallel to a measuring slice used in a subsequent measurement.

3. A magnetic resonance imaging apparatus as claimed in claim 1 wherein said system computer operates said gradient system to generate said oscillating read out gradient with positive and negative lobes, and wherein said signals for obtaining said spatially resolved navigator rod are read out in each of said positive and negative lobes.

4. A magnetic resonance imaging apparatus as claimed in claim 1 wherein said system computer operates said gradient system to generate said oscillating read out gradient with positive and negative lobes, and where said signals for obtaining said spatially resolved navigator rod are read out in only one of said positive lobe and said negative lobe.

5. A magnetic resonance imaging apparatus as claimed in claim 1 further comprising an imaging computer supplied with said signals for obtaining said navigator rod, said imaging computer respectively weighting signals obtained from a column or row of a navigator slice fixed by said slice selection direction, to obtain weighted signals, and adding said weighted signals to form an aggregate echo, and for calculating said navigator rod from said aggregate echo.

6. A method for operating a magnetic resonance imaging apparatus comprising the steps of:

exciting nuclear spins in an examination subject with an excitation pulse having a flip angle of less than 90°;

activating a slice selection gradient in a slice selection direction;

activating a phase encoding gradient;

activating an oscillating read out gradient in a read out direction, and reading out a plurality of gradient echoes after said excitation pulse; and obtaining a spatially resolved navigator rod by reading out echoes from a single slice produced by excitation of said nuclear spins which is made slice selective by said selective excitation with gradient and said flip angle, with phase encoding in a direction perpendicular to said slice selection direction and perendicular to said read out direction.

7. A method as claimed in claim 6 comprising fixing a navigator slice in said slice election direction, as said single slices parallel to a measuring slice used in a subsequent measurement.

8. A method as claimed in claim 6 wherein said oscillating read out gradient has positive and negative lobes, and using gradient echoes in each of said lobes for obtaining said navigator rod.

9. A method as claimed in claim 6 wherein said oscillating read out gradient has positive and negative lobes, and using gradient echoes from only one of said lobes for obtaining said navigator rod.

10. A method as claimed in claim 7 comprising respectively weighting signals from a column or a row of said navigator slice fixed by said slice selection direction, adding said weighted signals to form an aggregate echo, and obtaining said navigator rod from said aggregate echo.

* * * * *